US 9,413,038 B2

(12) United States Patent
Choi et al.

(10) Patent No.: US 9,413,038 B2
(45) Date of Patent: Aug. 9, 2016

(54) BATTERY MODULE OF IMPROVED STABILITY

(71) Applicant: LG CHEM, LTD., Seoul (KR)

(72) Inventors: Jun Seok Choi, Daejeon (KR); Jin Kyu Lee, Daejeon (KR); SeongTae Kim, Incheon (KR); Tae Hyuck Kim, Daejeon (KR); Tae Hwan Roh, Daejeon (KR); Yong Shik Shin, Daejeon (KR); DalMo Kang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 141 days.

(21) Appl. No.: 14/161,400

(22) Filed: Jan. 22, 2014

(65) Prior Publication Data
US 2014/0134462 A1    May 15, 2014

Related U.S. Application Data

(63) Continuation of application No. PCT/KR2012/005846, filed on Jul. 23, 2012.

(30) Foreign Application Priority Data

Aug. 1, 2011  (KR) .................. 10-2011-0076741

(51) Int. Cl.
*H01M 10/48* (2006.01)
*H01M 10/42* (2006.01)
(Continued)

(52) U.S. Cl.
CPC ......... *H01M 10/4207* (2013.01); *B60L 3/0046* (2013.01); *B60L 11/1861* (2013.01); *B60L 11/1874* (2013.01); *B60L 11/1879* (2013.01); *H01M 2/206* (2013.01); *H01M 2/305* (2013.01); *H01M 10/482* (2013.01);
(Continued)

(58) Field of Classification Search
CPC .... H01M 10/482; H01M 10/48; H01M 2/206
See application file for complete search history.

(56) References Cited

U.S. PATENT DOCUMENTS

| 8,405,352 B2 | 3/2013 | Lim |
| 8,570,695 B2 | 10/2013 | Shibuya et al. |

(Continued)

FOREIGN PATENT DOCUMENTS

| CN | 101395490 A | 3/2009 |
| CN | 101395739 A | 3/2009 |

(Continued)

OTHER PUBLICATIONS

International Search Report, issued in PCT/KR2012/005846, dated Jan. 31, 2013.

*Primary Examiner* — Stewart Fraser
*Assistant Examiner* — Olatunji Godo
(74) *Attorney, Agent, or Firm* — Birch, Stewart, Kolasch & Birch, LLP

(57) ABSTRACT

Disclosed herein is a battery module having a plurality of battery cells electrically connected to each other, the battery module including a voltage sensing unit including voltage sensing terminals electrically connected to electrode terminal connection portions of the battery cells and a conduction part connected to the voltage sensing terminals to transmit voltages detected by the voltage sensing terminals to a module control unit and a signal cutoff unit located between the voltage sensing terminals and the conduction part to interrupt transmission of the detected voltages when a short circuit occurs in the conduction part.

20 Claims, 7 Drawing Sheets

(51) Int. Cl.
  *B60L 11/18* (2006.01)
  *B60L 3/00* (2006.01)
  *H01M 2/20* (2006.01)
  *H01M 2/30* (2006.01)
  *G01R 31/36* (2006.01)

(52) U.S. Cl.
  CPC ..... *B60L 2240/545* (2013.01); *B60L 2240/547* (2013.01); *B60L 2240/549* (2013.01); *B60L 2270/145* (2013.01); *G01R 31/362* (2013.01); *G01R 31/3658* (2013.01); *H01M 2010/4271* (2013.01); *H01M 2200/103* (2013.01); *Y02T 10/705* (2013.01); *Y02T 10/7005* (2013.01); *Y02T 10/7011* (2013.01); *Y02T 10/7044* (2013.01)

(56) References Cited

U.S. PATENT DOCUMENTS

| | | | |
|---|---|---|---|
| 2008/0152994 A1 | 6/2008 | Yamagami et al. | |
| 2009/0214936 A1* | 8/2009 | Yang | G01R 31/3696 429/61 |
| 2009/0309545 A1 | 12/2009 | Kunimitsu | |
| 2010/0021802 A1 | 1/2010 | Yang et al. | |
| 2011/0070474 A1 | 3/2011 | Lee et al. | |
| 2011/0189514 A1* | 8/2011 | Lee | H01M 2/1077 429/61 |
| 2013/0100563 A1 | 4/2013 | Cho et al. | |
| 2013/0101874 A1* | 4/2013 | Pevear | H02J 7/0026 429/50 |

FOREIGN PATENT DOCUMENTS

| | | |
|---|---|---|
| CN | 101395740 A | 3/2009 |
| CN | 101395737 B | 6/2011 |
| JP | 2009-529136 A | 8/2009 |
| JP | 2009-219215 A | 9/2009 |
| JP | 2010-25925 A | 2/2010 |
| JP | 2010-130897 A | 6/2010 |
| KR | 10-0884944 B1 | 2/2009 |
| KR | 10-0948002 B1 | 3/2010 |
| KR | 10-2010-0109871 A | 10/2010 |
| KR | 10-1047831 B1 | 7/2011 |
| WO | WO 2010/128792 A2 | 11/2010 |
| WO | WO 2011069162 * | 6/2011 |

* cited by examiner

BATTERY MODULE OF IMPROVED STABILITY

CROSS REFERENCE TO RELATED APPLICATIONS

This application is a Continuation of PCT International Application No. PCT/KR2012/005846 filed on Jul. 23, 2012, which claims the benefit of Patent Application No. 10-2011-0076741 filed in the Republic of Korea on Aug. 1, 2011, all of which are hereby expressly incorporated by reference into the present application.

TECHNICAL FIELD

The present invention relates to a battery module with improved safety and, more particularly, to a battery module having a plurality of battery cells electrically connected to each other, the battery module including a voltage sensing unit including voltage sensing terminals electrically connected to electrode terminal connection portions of the battery cells and a conduction part connected to the voltage sensing terminals to transmit voltages detected by the voltage sensing terminals to a module control unit and a signal cutoff unit located between the voltage sensing terminals and the conduction part to interrupt transmission of the detected voltages when a short circuit occurs in the conduction part.

BACKGROUND ART

Recently, a secondary battery, which can be charged and discharged, has been widely used as an energy source for wireless mobile devices. In addition, the secondary battery has attracted considerable attention as a power source for devices which require high output and large capacity, such as electric vehicles (EV), hybrid electric vehicles (HEV), and plug-in hybrid electric vehicles (Plug-in HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, use a battery module having a plurality of battery cells electrically connected to each other because high output and large capacity are necessary for the middle or large-sized devices.

Preferably, a battery module is manufactured so as to have as small a size and weight as possible. For this reason, a prismatic battery or a pouch-shaped battery, which can be stacked with high integration and has a small weight to capacity ratio, is usually used as a battery cell of a middle or large-sized battery module. In particular, much interest is currently focused on the pouch-shaped battery, which uses an aluminum laminate sheet as a sheathing member, because the pouch-shaped battery is lightweight and the manufacturing cost of the pouch-shaped battery is low.

In addition, the battery module is configured to have a structure in which a plurality of battery cells is combined. In a case in which overvoltage is applied to some of the battery cells, overcurrent flows in some of the battery cells, or some of the battery cells overheat, therefore, safety and operation efficiency of the battery module are seriously concerned. For this reason, it is necessary to provide means to detect and control such overvoltage, overcurrent, or the overheating.

Consequently, voltage sensors are connected to the respective battery cells to check and control operation states of the battery cells in real time or at predetermined time intervals.

However, installation or connection of such detection means very complicates a process for assembling the battery module. In addition, there is a possibility that a short circuit may occur due to a plurality of wires for the detection means.

In addition, as a secondary battery is used as a power source for vehicles as the result of extension in an application range of the secondary battery, it is necessary to provide fastening members to retain stable contact states of the detection means even when string impact or vibration is applied to the secondary battery.

In case of lithium ion secondary batteries, on the other hand, it is necessary to measure voltages of the respective batteries using a voltage sensing unit in order to check states of the respective batteries. For this reason, safety of the batteries is seriously concerned in a case in which a short circuit occurs in the voltage sensing unit.

In addition, protection of the voltage sensing unit when the safety of the batteries is seriously concerned is very important for a battery system.

Consequently, there is a high necessity for a battery module that is compact and exhibits improved safety while fundamentally solving the above problems.

DISCLOSURE

Technical Problem

Therefore, the present invention has been made to solve the above problems and other technical problems that have yet to be resolved.

It is an object of the present invention to provide a battery module configured to have a structure in which a signal cutoff unit is located between voltage sensing terminals and a conduction part to interrupt transmission of detected voltages when a short circuit occurs in the conduction part, thereby improving safety of the battery module.

It is another object of the present invention to prevent a conduction part from catching fire and to stop a voltage sensing operation of a battery module through the use of a signal cutoff unit.

Technical Solution

In accordance with one aspect of the present invention, the above and other objects can be accomplished by the provision of a battery module having a plurality of battery cells electrically connected to each other, the battery module including a voltage sensing unit including voltage sensing terminals electrically connected to electrode terminal connection portions of the battery cells and a conduction part connected to the voltage sensing terminals to transmit voltages detected by the voltage sensing terminals to a module control unit and a signal cutoff unit located between the voltage sensing terminals and the conduction part to interrupt transmission of the detected voltages when a short circuit occurs in the conduction part.

In the battery module according to the present invention, therefore, the signal cutoff unit is located between the voltage sensing terminals and the conduction part to interrupt transmission of detected voltages when a short circuit occurs in the conduction part, thereby greatly improving safety of the battery module.

In a preferred example, each of the voltage sensing terminals may be configured to have a receptacle structure such that the voltage sensing terminals can be easily fastened to the conduction part.

The conduction part may be configured to have a wire harness structure such that the voltages detected by the voltage sensing terminals can be easily transmitted to the module control unit.

Preferably, the wire harness is configured to have a structure in which one insulative member surrounds nine wires.

Specifically, in a case in which a short circuit occurs in the wires connected between the voltage sensing terminals and the module control unit due to external force, the signal cutoff unit is broken by instantaneously generated high current with the result that voltage signals detected by the voltage sensing terminals cannot be transmitted to the module control unit.

In addition, the battery module according to the present invention may prevent the voltage sensing terminals from catching fire and stop a voltage sensing operation of the battery module through the use of the signal cutoff unit.

The module control unit may control operation of the battery module based on the voltage signals detected by the voltage sensing terminals. For example, the module control unit may be a battery management system (BMS). However, the present invention is not limited thereto.

In a concrete example, the battery module may be configured to have a structure including a cell unit stack including two or more hexahedral cell units electrically connected to each other in a stacked state, a module case in which the cell unit stack is mounted in a state in which the cell unit stack is erected on a side thereof, and voltage sensing terminals electrically connected to the electrode terminal connection portions of the battery cells.

In the above structure, the signal cutoff unit may be mounted at a front or a rear of the module case.

In a preferred example, the signal cutoff unit may include a fuse box having fuses mounted therein. In a case in which the signal cutoff unit malfunctions, therefore, it is enough to replace only the fuse box, thereby improving maintenance of the signal cutoff unit.

The fuse box may have various structures, an example of which is as follows.

In an example, the fuse box may include a circuit board, at which the fuses are mounted, and a cover covering the circuit board to protect the circuit board. When the fuses are broken, therefore, it is enough to replace only the circuit board, thereby improving maintenance of the fuse box.

In the above structure, the fuses may be mounted on the circuit board, for example, by soldering to increase coupling force between the fuses and the circuit board.

According to circumstances, the fuses may be mounted on the circuit board in the shape of a receptacle terminal each, thereby improving assemblability of the fuse box.

The specification of each of the fuses may be changed based on the construction of the battery module. For example, each of the fuses may have a direct current voltage of 3 V to 500 V and a current of 1 A to 5 A. However, the present invention is not limited thereto.

Each of the battery cells is not particularly restricted so long as each of the battery cells is a secondary battery that can be charged and discharged. For example, each of the battery cells may be a lithium secondary battery, a nickel metal hydride (Ni-MH) secondary battery, or a nickel cadmium (Ni—Cd) secondary battery. Among such secondary batteries, the lithium secondary battery is preferably used because the lithium secondary battery exhibits a high output to weight ratio.

Each of the battery cells may be a plate-shaped secondary battery having a small thickness and a relatively large width and length so as to minimize the overall size of the battery module when the battery cells are stacked to constitute the battery module. A preferred example of the secondary battery may be a secondary battery configured to have a structure in which an electrode assembly is mounted in a battery case formed of a laminate sheet including a resin layer and a metal layer and electrode terminals protrude from upper and lower ends of the battery case. Specifically, the electrode assembly may be mounted in a pouch-shaped battery case formed of an aluminum laminate sheet. The secondary battery having the above structure may be referred to as a pouch-shaped battery cell.

Each of the battery cells may have electrode terminals formed at the upper end and the lower end thereof.

Meanwhile, the module case may include an upper case and a lower case, which are coupled each other by vertical assembly. Consequently, the assembly and disassembly between the upper case and the lower case may be easily achieved in a state in which the battery cell stack is mounted in the lower case.

In the above structure, the voltage sensing unit may include sensing unit frames mounted at a front and a rear of the lower case, voltage sensing terminals inserted into the sensing unit frames, and conduction part connected between the voltage sensing terminals.

In another example, the lower case may be provided inside the front and the rear thereof with fixing grooves, into which the electrical connection portions of the battery cells are inserted and mounted.

The lower case may be provided at the front thereof with a pair of slits, through which the outermost electrode terminals of the unit cell stack can be inserted.

The outermost electrode terminals may be bent to contact bus bars disposed at the rear of the lower case after the outermost electrode terminals are inserted through the slits. Preferably, upper ends of the bus bars may be formed in the shape of intended holes, through which external input and output terminals provided at a rear of the upper case are introduced when the upper case and the lower case are coupled to each other.

The lower case may be provided at the lower end of the front and/or the rear thereof with a fastening part, which protrudes from the lower case to fix the lower case to an external device, a through hole being formed at a middle part of the fastening part.

Meanwhile, each of the cell units may be configured to have a structure including two or more battery cells and a pair of plate-shaped sheathing members coupled to cover the outside of the battery cell stack excluding the electrode terminals.

Consequently, the sheathing members may protect the battery cells exhibiting low mechanical strength and restrain the repetitive expansion and contraction fluctuation during charge and discharge of the battery cells to prevent separation between sealed portions of the battery cells.

In the above structure, each of the cell units may further include a shock-absorbing member interposed at the interface between the battery cells to restrain movement of the battery cells and to absorb shock due to change in volume of the battery cells during charge and discharge of the battery cells.

Consequently, the shock-absorbing member absorbs shock due to change in volume of the battery cells caused by the repetitive expansion and contraction fluctuation during charge and discharge of the battery cells and increases frictional force between the battery cells to restrain movement of the battery cells.

The material for the shock-absorbing member interposed at the interface between the battery cells is not particularly restricted so long as the shock-absorbing member absorbs shock due to change in volume of the battery cells and increases frictional force between the battery cells to restrain movement of the battery cells. Preferably, the shock-absorbing member is formed of a polymer resin having a porous structure. The porous structure may include open pores or closed pores.

Kind of the polymer resin is not particularly restricted. For example, polyethylene, polypropylene, polybutylene, polystyrene, natural rubber, artificial rubber, NBR resin, ABS resin, etc. may be used.

Preferably, each of the sheathing members has an inner structure corresponding to an external shape of the battery cell stack. In particular, the sheathing members are coupled to each other by assembly and fastening without additional fastening members.

As a representative example of sectional coupling portions of the sheathing members, the sectional coupling portions of the sheathing members may be configured to have male and female fastening structures such that the sheathing members are engaged with each other through elastic coupling when the sheathing members are pushed in a state in which the sheathing members are in contact with each other such that the sheathing members face each other.

Meanwhile, heat is generated from the secondary battery during charge and discharge of the secondary battery. Effective dissipation of the generated heat is important to increase the lifespan of the battery. Consequently, each of the sheathing members may be formed of a metal sheet exhibiting high thermal conductivity to more easily dissipate heat generated from the battery cells in the sheathing members.

In a preferred example, each of the sheathing members may be provided at sides adjacent to upper and lower ends thereof with step parts having a predetermined size to easily fix the battery cells. According to circumstances, the step parts may be formed at sides adjacent to left and right ends of each of the sheathing members. More preferably, the step parts are formed at sides adjacent to the upper and lower ends and the left and right ends of each of the sheathing members to more securely fix the battery cells.

The battery cells may be fixed at the upper end and the lower end of each of the sheathing members in various forms. For more efficient fixing, depressed step parts are preferably provided while having a shape and size corresponding to sealed portions of the battery cells.

Movement of the battery cells is maximally restrained through a combination of the step parts formed at the sheathing members and the shock-absorbing member.

In a preferred example, each of the sheathing members according to the present invention may be provided at the outside thereof with a plurality of linear beads, which are spaced apart from each other in the lateral direction (horizontal direction), to provide a coolant flow space. In the above structure, each of the beads may be configured such that opposite ends of each of the beads reach corresponding ends of the sheathing member. In a state in which battery modules are stacked, therefore, a coolant (for example, air) may flow in the lateral direction of the sheathing members, thereby further improving cooling efficiency.

In addition, each of the sheathing members may be provided at the upper end and the lower end of the outside thereof with bars formed in shapes opposite to each other in the lateral direction (horizontal direction). When the battery modules are stacked, therefore, the sheathing member 200 has a shape corresponding to an adjacent one of the battery modules. Consequently, it is possible to prevent stacked positions between the battery modules from being reversed or deviating from each other.

In accordance with another aspect of the present invention, there is provided a battery pack configured to have a structure including two or more battery modules based on output and capacity.

The battery pack is manufactured by electrically and mechanically interconnecting a plurality of secondary batteries such that the battery pack can provide high output and large capacity. For example, the battery pack may be manufactured by mounting a stack of two or more battery modules in a pack frame in a state in which the battery module stack is erected in the lateral direction.

In accordance with a further aspect of the present invention, there is provided a vehicle using the battery pack as a power source.

In particular, the vehicle with the above structure may be used as an electric vehicle, a hybrid electric vehicle, or a plug-in hybrid electric vehicle in consideration of installation efficiency and structural stability based on desired output and capacity.

Effects of the Invention

As is apparent from the above description, the battery module according to the present invention is configured such that the signal cutoff unit is located between the voltage sensing terminals and the conduction part to interrupt transmission of detected voltages when a short circuit occurs in the conduction part, thereby increasing operation or lifespan characteristics of batteries and securing safety of the battery module.

DESCRIPTION OF DRAWINGS

The above and other objects, features and other advantages of the present invention will be more clearly understood from the following detailed description taken in conjunction with the accompanying drawings, in which.

BEST MODE

Now, preferred embodiments of the present invention will be described in detail with reference to the accompanying drawings. It should be noted, however, that the scope of the present invention is not limited by the illustrated embodiments.

Figure 1:
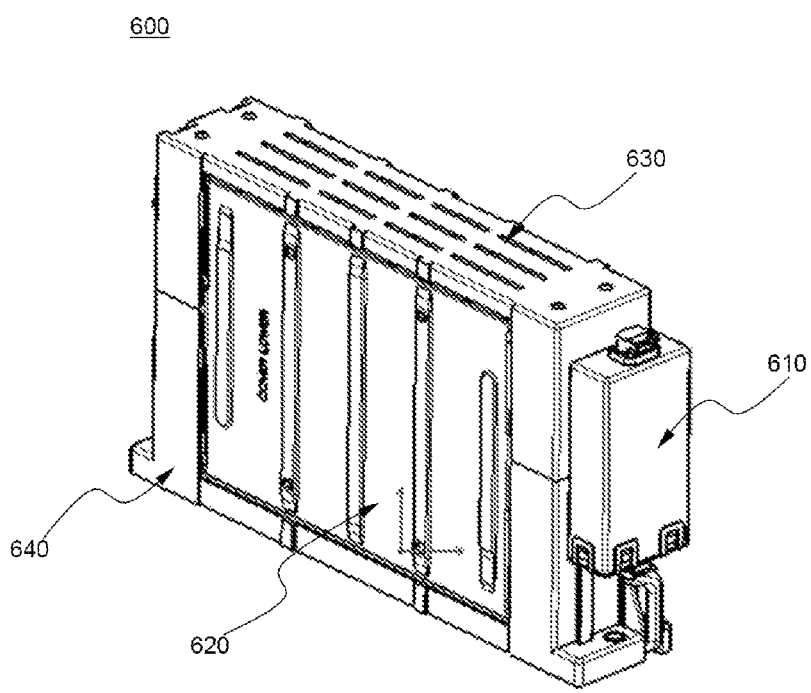
FIG. 1 is a perspective view showing a battery module according to an embodiment of the present invention.
Figure 2:
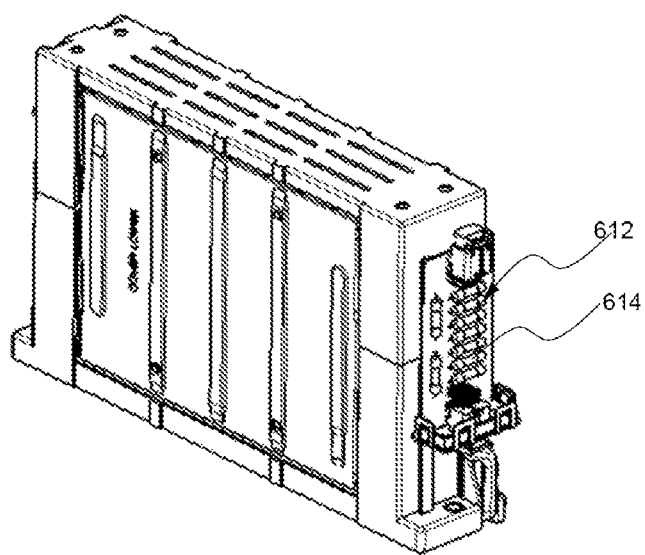
FIG. 2 is a perspective view showing a state in which a cover is removed from the battery module of FIG. 1.

FIG. 1 is a perspective view typically showing a battery module according to an embodiment of the present invention and FIG. 2 is a perspective view typically showing a state in which a cover is removed from the battery module of FIG. 1.

Referring to these drawings, a battery module 600 includes a voltage sensing unit (not shown), a battery management system (BMS) functioning as a module control unit, and a signal cutoff unit 610.

The voltage sensing unit is connected to electrical connection portions of battery cells and the BMS controls operation of the battery module 600 based on a voltage signal detected by the voltage sensing unit.

In addition, the signal cutoff unit 610 is mounted between the voltage sensing unit and the BMS to cut off transmission of the detected voltage signal when a short circuit occurs in the voltage sensing unit. When transmission of the detected voltage signal is cut off, the BMS stops operation of the battery module 600.

The battery module 600 includes a cell unit stack 620 including two hexahedral cell units electrically connected to each other in a stacked state, a module case in which the cell unit stack 620 is mounted in a state in which the cell unit stack 620 is erected on the side thereof, and voltage sensing terminals electrically connected to electrode terminal connection portions of battery cells.

The module case includes an upper case 630 and a lower case 640, which are coupled each other by vertical assembly. The signal cutoff unit 610 is mounted to the front of the module case.

The signal cutoff unit 610 includes a fuse box having fuses 614 mounted therein. The fuse box includes a circuit board 612, on which the fuses 614 are mounted by soldering, and a cover covering the circuit board to protect the circuit board.

Figure 3:
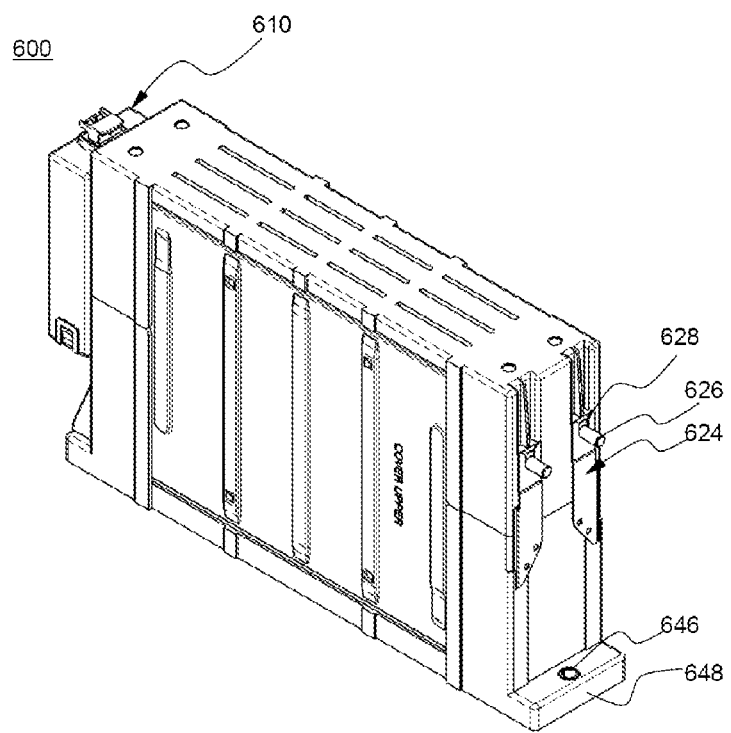
FIG. 3 is a perspective view showing a state in which the front and rear of the battery module of FIG. 1 are rotated by 180 degrees.
Figure 4:
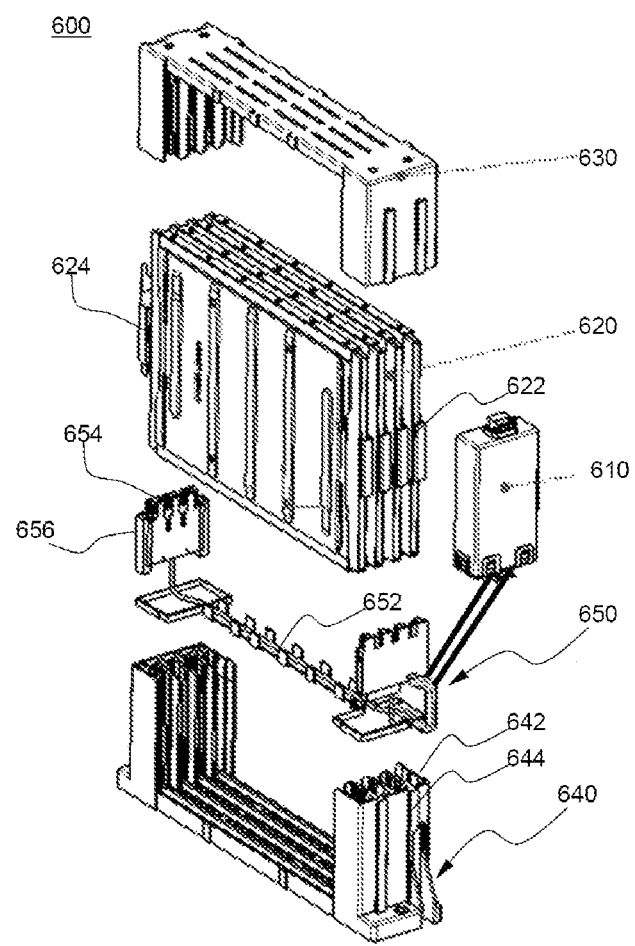
FIG. 4 is an exploded perspective view of FIG. 1.
Figure 5:
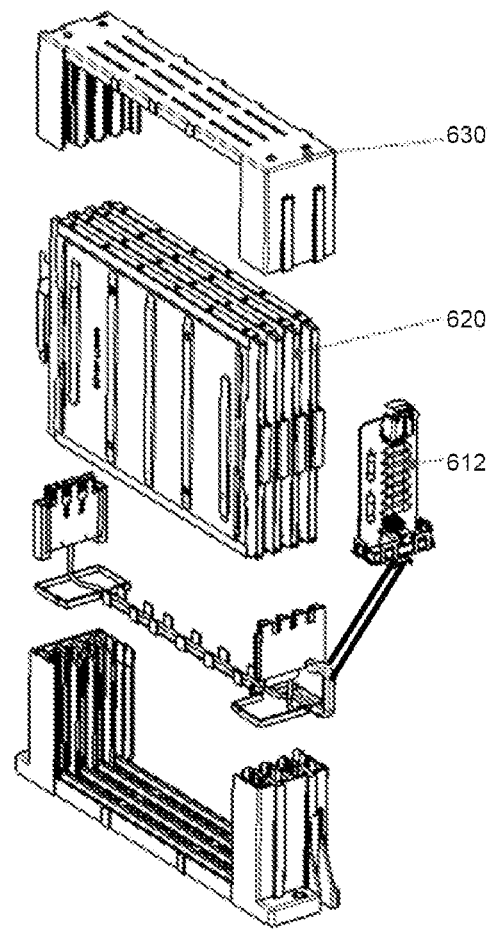
FIG. 5 is an exploded perspective view of FIG. 2.

FIG. 3 is a perspective view typically showing a state in which the front and rear of the battery module of FIG. 1 are rotated by 180 degrees, FIG. 4 is an exploded perspective view of FIG. 1, and FIG. 5 is an exploded perspective view of FIG. 2.

Referring to these drawings, the battery module 600 includes the voltage sensing unit 650 and the signal cutoff unit 610.

The voltage sensing unit 650 includes voltage sensing terminals 654 electrically connected to the electrode terminal connection portions of the battery cells and a conduction part 652 connected to the voltage sensing terminals 654 to transmit voltages detected by the voltage sensing terminals 654 to a module control unit.

The signal cutoff unit 610 is located between the voltage sensing terminals 654 and the conduction part 652 to interrupt transmission of the detected voltages when a short circuit occurs in the conduction part 652.

Each of the voltage sensing terminals 654 is configured to have a receptacle structure and the conduction part 652 is configured to have a wire harness structure.

Specifically, the wire harness is configured to have a structure in which one insulative member surrounds nine wires.

The voltage sensing unit 650 includes sensing unit frames 656 mounted at the front and the rear of the lower case 640, the voltage sensing terminals 654 inserted into the sensing unit frames 656, and the conduction part 652 connected between the voltage sensing terminals 654.

The lower case 640 is provided inside the front and the rear thereof with fixing grooves 642, into which the electrical connection portions of the battery cells are inserted and mounted. The lower case 640 is provided at the front thereof with a pair of slits 644, through which the outermost electrode terminals of the unit cell stack can be inserted.

After the outermost electrode terminals are inserted through the slits 644, the outermost electrode terminals are bent to contact bus bars 624 disposed at the rear of the lower case 640. The upper ends of the bus bars 624 are formed in the shape of intended holes 628, through which external input and output terminals 626 provided at the rear of the upper case 630 are introduced when the upper case 630 and the lower case 640 are coupled to each other.

In addition, the lower case 640 is provided at the lower ends of the front and the rear thereof with fastening parts 648, which protrude from the lower case 640 to fix the lower case to an external device. A through hole 646 is formed at the middle of each of the fastening parts 648.

Figure 6:
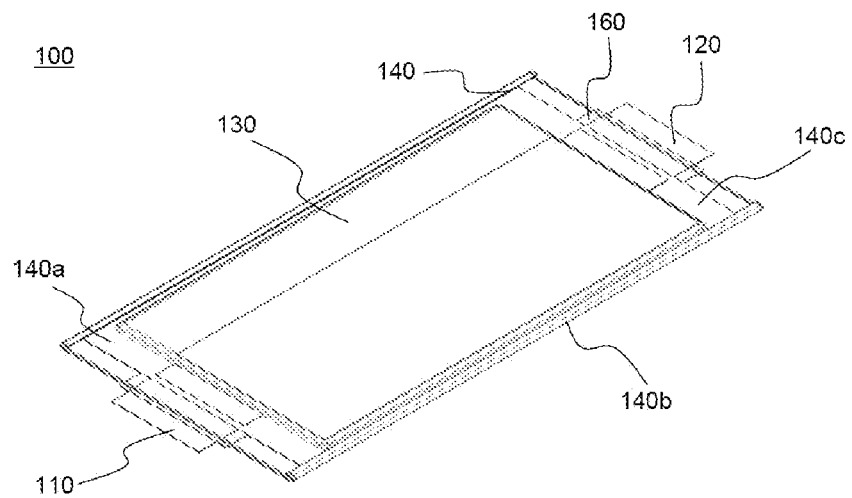
FIG. 6 is an exploded perspective view showing the structure of a pouch-shaped secondary battery.

FIG. 6 is an exploded perspective view typically showing the structure of a pouch-shaped secondary battery.

Referring to FIG. 6, a pouch-shaped battery 100 is configured to have a structure in which two electrode leads 110 and 120 protrude from the upper end and the lower end of a battery body 130, respectively, in a state in which the electrode leads 110 and 120 are opposite to each other.

A sheathing member 140 is a two-unit member. In a state in which an electrode assembly (not shown) is mounted in a receiving part formed in the sheathing member 140, lateral sides 140b, upper ends 140a, and lower ends 140c, which are contact regions, of the sheathing member 140 are bonded to each other, whereby the battery cell 100 is manufactured. The sheathing member 140 is configured to have a laminate structure of a resin layer/a metal foil layer/a resin layer. Consequently, it is possible to bond the lateral sides 140b and the upper and lower ends 140a and 140c of the sheathing member 140, which are in contact with each other, to each other by applying heat and pressure to the lateral sides 140b and the upper and lower ends 140a and 140c of the sheathing member 140 so as to weld the resin layers thereof to each other. According to circumstances, the lateral sides 140b and the upper and lower ends 140a and 140c of the sheathing member 140 may be bonded to each other using a bonding agent.

In case of the lateral sides 140b of the sheathing member 140, the same resin layers of upper and lower sheathing parts of the sheathing member 140 are in direct contact with each other, whereby uniform sealing at the lateral sides 140b of the sheathing member 140 is accomplished by welding. In case of the upper ends 140a and the lower ends 140c of the sheathing member 140, on the other hand, the electrode leads 110 and 120 protrude from the upper ends 140a and the lower ends 140c of the sheathing member 140, respectively. For this reason, the upper and lower ends 140a and 140c of the sheathing member 140 are thermally welded to each other, in a state in which film type sealing members 160 are interposed between the electrode terminals 110 and 120 and the sheathing member 140, in consideration of the thickness of the electrode leads 110 and 120 and the difference in material between the electrode leads 110 and 120 and the sheathing member 140, so as to improve sealability of the sheathing member 140.

Figure 7:
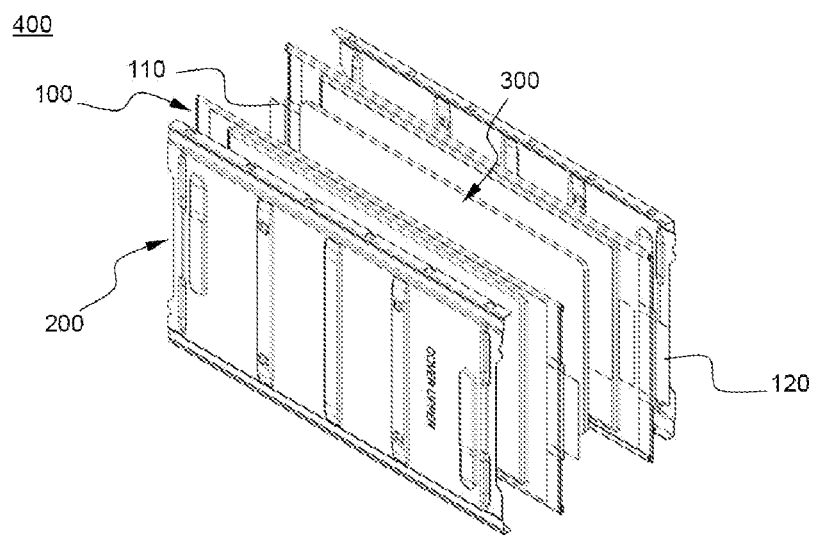
FIG. 7 is an exploded perspective view showing a cell unit according to another embodiment of the present invention.

FIG. 7 is an exploded perspective view typically showing a cell unit according to another embodiment of the present invention.

Referring to FIG. 7, a cell unit 400 includes plate-shaped battery cells 100, each of which has electrode terminals 110 and 120 formed at the upper end and the lower end thereof, respectively. A shock-absorbing member 300 is interposed at an interface between two battery cells 100. A pair of sheathing members 200 is coupled to each other to cover the battery cells 100.

The shock-absorbing member 300 is formed of a porous polymer resin. Consequently, the shock-absorbing member 300 absorbs shock due to change in volume of the battery cells caused by the repetitive expansion and contraction fluctuation during charge and discharge of the battery cells and increases frictional force between the battery cells to restrain movement of the battery cells.

The sheathing members 200 are coupled to each other to cover the outside of a stack of the battery cells 100 excluding the electrode terminals 110 and 120 formed. The sheathing members 200 protect the battery cells exhibiting low mechanical strength and restrain the repetitive expansion and contraction fluctuation during charge and discharge of the battery cells to prevent separation between sealed portions of the battery cells.

Figure 8:
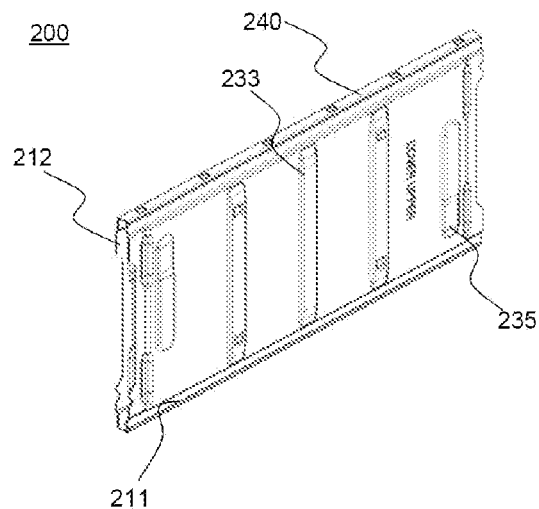
FIG. 8 is a perspective view showing a sheathing member of FIG. 7.
Figure 9:
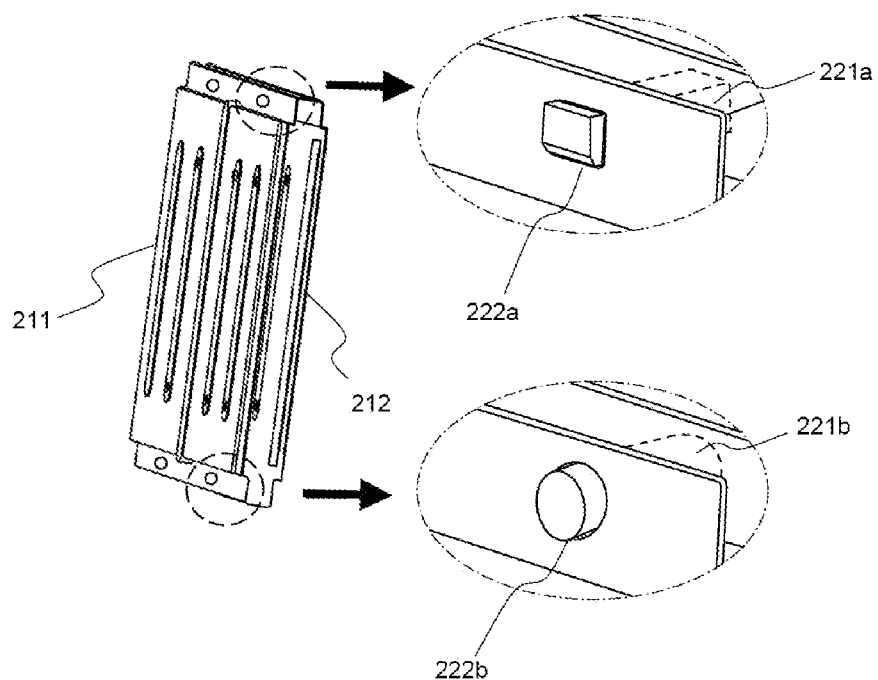
FIG. 9 is an enlarged view showing coupling structures of the sheathing member of FIG. 7.

FIG. 8 is a perspective view typically showing the sheathing member of FIG. 7 and FIG. 9 is an enlarged view typically showing coupling structures of the sheathing members of FIG. 7.

Referring to these drawings together with FIG. 7, the sheathing member 200 is provided at sides adjacent to left and right ends thereof with step parts 240 to easily fix a module. In addition, the sheathing member 200 is provided at the outside thereof with a plurality of linear beads 233, which are spaced apart from each other in the lateral direction. Each of the beads 233 is configured such that opposite ends of each of the beads 233 reach corresponding ends of the sheathing member. In a state in which battery modules are stacked, therefore, a coolant (for example, air) may flow in the lateral direction of the sheathing member, thereby further improving cooling efficiency.

In addition, the sheathing member 200 is provided at the upper end and the lower end of the outside thereof with bars 235 formed in shapes opposite to each other in the lateral direction (horizontal direction). When the battery modules are stacked, therefore, the sheathing member 200 has a shape corresponding to an adjacent one of the battery modules. Consequently, it is possible to prevent stacked positions between the battery modules from being reversed or deviating from each other.

In addition, the sheathing member 200 includes a pair of left cell cover 211 and right cell cover 212, which may be coupled to each other without using additional fastening members.

A coupling structure of the sheathing member 200 is shown in detail in FIG. 7. A sectional view and a partially enlarged view of the sheathing member 200 are shown in FIG. 7. Referring to FIG. 7, the sheathing members 211 and 212 are configured to have male and female fastening structures 221 and 222 such that the sheathing members 211 and 212 are engaged with each other through elastic coupling when the sheathing members 211 and 212 are pushed in a state in which the sheathing members 211 and 212 are in contact with each other such that the sheathing members 211 and 212 face each other.

Various fastening structures, such as hexahedral fastening structures 221a and 222a and cylindrical fastening structures 221b and 222b, may be provided. During a fastening process, the fastening structures are engaged with each other to increase coupling force.

Consequently, strong mechanical coupling of the sheathing member 200 is achieved without additional coupling members or processes to assemble the sheathing member 200. In particular, such a simple coupling method is preferably applied to mass production.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A battery module having a plurality of battery cells electrically connected to each other, the battery module comprising:
    a voltage sensing unit comprising voltage sensing terminals electrically connected to electrode terminal connection portions of the battery cells and a conduction part connected to the voltage sensing terminals to transmit voltages detected by the voltage sensing terminals to a module control unit;
    a signal cutoff unit located between the voltage sensing terminals and the conduction part to interrupt transmission of the detected voltages when a short circuit occurs in the conduction part;
    a cell unit stack comprising two or more hexahedral cell units electrically connected to each other in a stacked state; and
    a module case, the cell unit stack mounted on a side of the module case,
    wherein the module case comprises an upper case and a lower case, which are coupled each other by vertical assembly,
    wherein the voltage sensing unit comprises sensing unit frames mounted at a front and a rear of the lower case,
    wherein the voltage sensing terminals are inserted into the sensing unit frames, and
    wherein the conduction part is connected between the voltage sensing terminals.

2. The battery module according to claim 1, wherein each of the voltage sensing terminals is configured to have a receptacle structure.

3. The battery module according to claim 1, wherein the conduction part is configured to have a wire harness structure.

4. The battery module according to claim 3, wherein the wire harness is configured to have a structure in which one insulative member surrounds nine wires.

5. The battery module according to claim 1, wherein the module control unit controls operation of the battery module based on voltage signals detected by the voltage sensing terminals.

6. The battery module according to claim 5, wherein the module control unit is a battery management system (BMS).

7. The battery module according to claim 1, wherein the signal cutoff unit is mounted at a front or a rear of the module case.

8. The battery module according to claim 1, wherein the signal cutoff unit comprises a fuse box having fuses mounted therein.

9. The battery module according to claim 8, wherein the fuse box comprises a circuit board, at which the fuses are mounted, and a cover covering the circuit board to protect the circuit board.

10. The battery module according to claim 8, wherein the fuses are mounted on the circuit board by soldering.

11. The battery module according to claim 8, wherein the fuses are mounted on the circuit board in the shape of a receptacle terminal each.

12. The battery module according to claim 1, wherein each of the battery cells has electrode terminals formed at an upper end and a lower end thereof.

13. The battery module according to claim 1, wherein the lower case is provided inside the front and the rear thereof with fixing grooves, into which the electrical connection portions of the battery cells are inserted and mounted.

14. The battery module according to claim 1, wherein the lower case is provided at the front thereof with a pair of slits, through which outermost electrode terminals of the unit cell stack are inserted.

15. The battery module according to claim 14, wherein the outermost electrode terminals are bent to contact bus bars disposed at the rear of the lower case after the outermost electrode terminals are inserted through the slits.

16. The battery module according to claim 15, wherein upper ends of the bus bars are formed in the shape of intended holes, through which external input and output terminals provided at a rear of the upper case are introduced when the upper case and the lower case are coupled to each other.

17. The battery module according to claim 1, wherein the lower case is provided at a lower end of the front and/or the rear thereof with a fastening part, which protrudes from the lower case to fix the lower case to an external device, a through hole being formed at a middle part of the fastening part.

18. A battery pack of high output and large capacity configured to have a structure comprising two or more battery modules according to claim 1 based on output and capacity.

19. An electric vehicle or a hybrid electric vehicle comprising the battery pack according to claim 18 as a power source.

20. A hybrid electric vehicle comprising the battery pack according to claim 18 as a power source, wherein the hybrid electric vehicle is a plug-in hybrid electric vehicle.

\* \* \* \* \*